(12) United States Patent
Silvarahawk

(10) Patent No.: US 6,351,230 B1
(45) Date of Patent: Feb. 26, 2002

(54) DACTRANS MATCHCADO

(76) Inventor: Aldea Silvarahawk, P.O. Box 60084, St Pete, FL (US) 33784

( * ) Notice: Subject to any disclaimer, the term of this patent is extended or adjusted under 35 U.S.C. 154(b) by 0 days.

(21) Appl. No.: 09/246,914

(22) Filed: Feb. 9, 1999

Related U.S. Application Data

(60) Provisional application No. 60/074,137, filed on Feb. 9, 1998.

(51) Int. Cl.[7] .................................................. H03M 1/66
(52) U.S. Cl. ........................................................ 341/144
(58) Field of Search ................................. 341/126, 144, 341/155

(56) References Cited

U.S. PATENT DOCUMENTS

| | | | |
|---|---|---|---|
| 6,031,476 A | * | 2/2000 | Sato et al. .................. 341/144 |
| 6,034,630 A | * | 3/2000 | Komatsu et al. ............ 341/159 |
| 6,040,794 A | * | 3/2000 | Jaw ............................. 341/155 |
| 6,049,300 A | * | 4/2000 | Shoval ........................ 341/144 |
| 6,052,074 A | * | 4/2000 | Lida ............................ 341/135 |
| 6,052,076 A | * | 4/2000 | Patton, III et al. .......... 341/144 |

* cited by examiner

*Primary Examiner*—Brian Young
(74) *Attorney, Agent, or Firm*—Saliwanchik, Lloyd & Saliwanchik

(57) ABSTRACT

In the field of electronics, this device is functional as a new breed of amplifier in the tri-transistor configuration is a class-A though Class-B and even into Class 'C' amplifier level with minimal wave form distortion, by virtue of this circuit's ability to diminish gain internally by auto proportion. The only change to this amplifier is how hard you drive the input. Beginning from the input signal through the biasing circuits to the first transition circuit to the input of the bi-modulating transition circuit, yielding the output of this amplifier.

1 Claim, 13 Drawing Sheets

Block Diagram View for the CADo

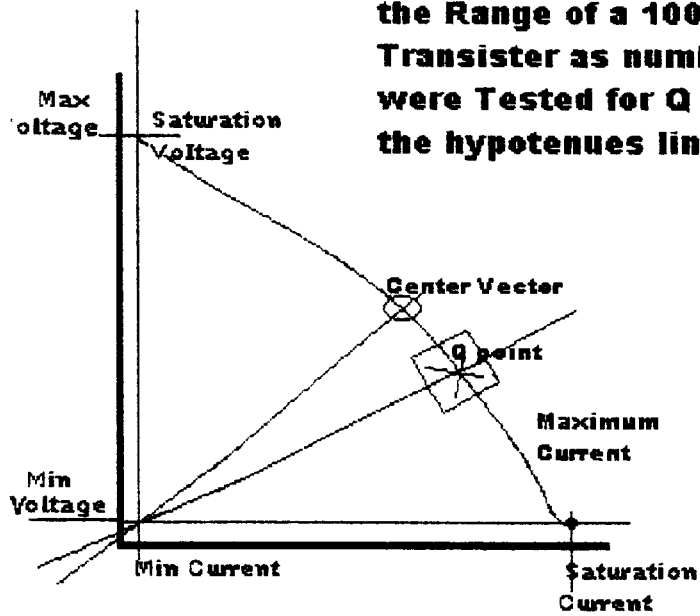

These Views are the exstreme ends of the Range of a 1000 different Typical Transister as numbered 2N2222A That were Tested for Q line straightness of the hypotenues line.

Voltage supply ripple of 55 micro volt at two ampere load. before and after the testing. each day testing at room temp 25 to 27 degrees C.

Quincent Curve for Alpha Configuration

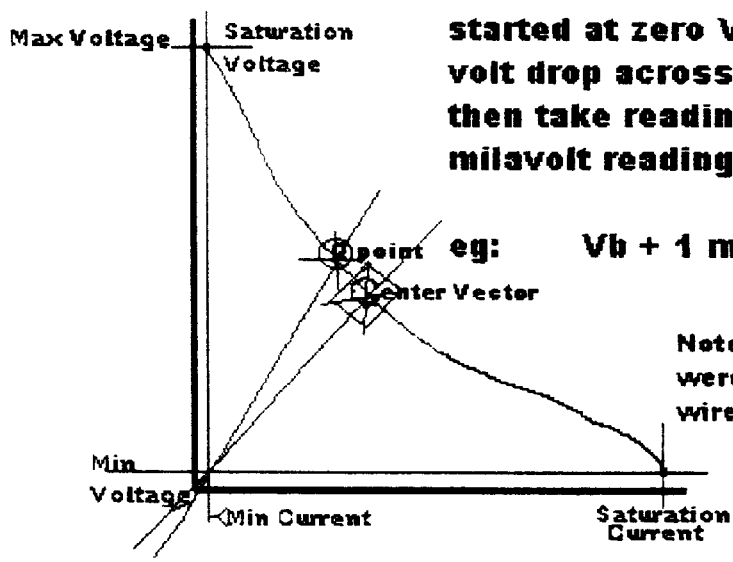

The values are plotted by the voltage drop across it's collector resister while it's base voltage started at zero Volts plus one mila volt drop across one ohm resister then take reading and add another milavolt reading at base resister.

eg:  $Vb + 1$ mils volt = $Vb$

Note: R of c and R of b were 1% stainless steel wire wound resisters.

Quincent Curve for Beta Configuration

Old Art Test Range: Q point

FIG. 2

Q Point graph for Tri-Transister's

The Old ART od Transister

OldArt.EWB

| Parameter | Value |
|---|---:|
| Initial TStep | 520.83333p |
| Initial TMax | 1.04167n |
| Nominal temperature | 27.00000 |
| Operating temperature | 27.00000 |
| Total iterations | 2.55100K |
| Transient iterations | 2.54600K |
| Circuit Equations | 9.00000 |
| Transient timepoints | 690.00000 |
| Accepted timepoints | 690.00000 |
| Rejected timepoints | 0.00000 |
| Total Analysis Time | 12.80000 |
| Transient time | 12.80000 |
| matrix reordering time | 0.00000 |
| L-U decomposition time | 660.00000m |
| Matrix solve time | 750.00000m |
| transient L-U decomp time | 660.00000m |
| Transient solve time | 750.00000m |
| Transient iters per point | 0.00000 |
| Load time | 1.68000 |

FIG. 7

Circuit Diagram for the Feed Foward Current Opperational Amplifier

Circuit Diagram for the Bit Switch

The Auto-Clock

Over View as Main Block Diagram for
DAC trans-match CAD

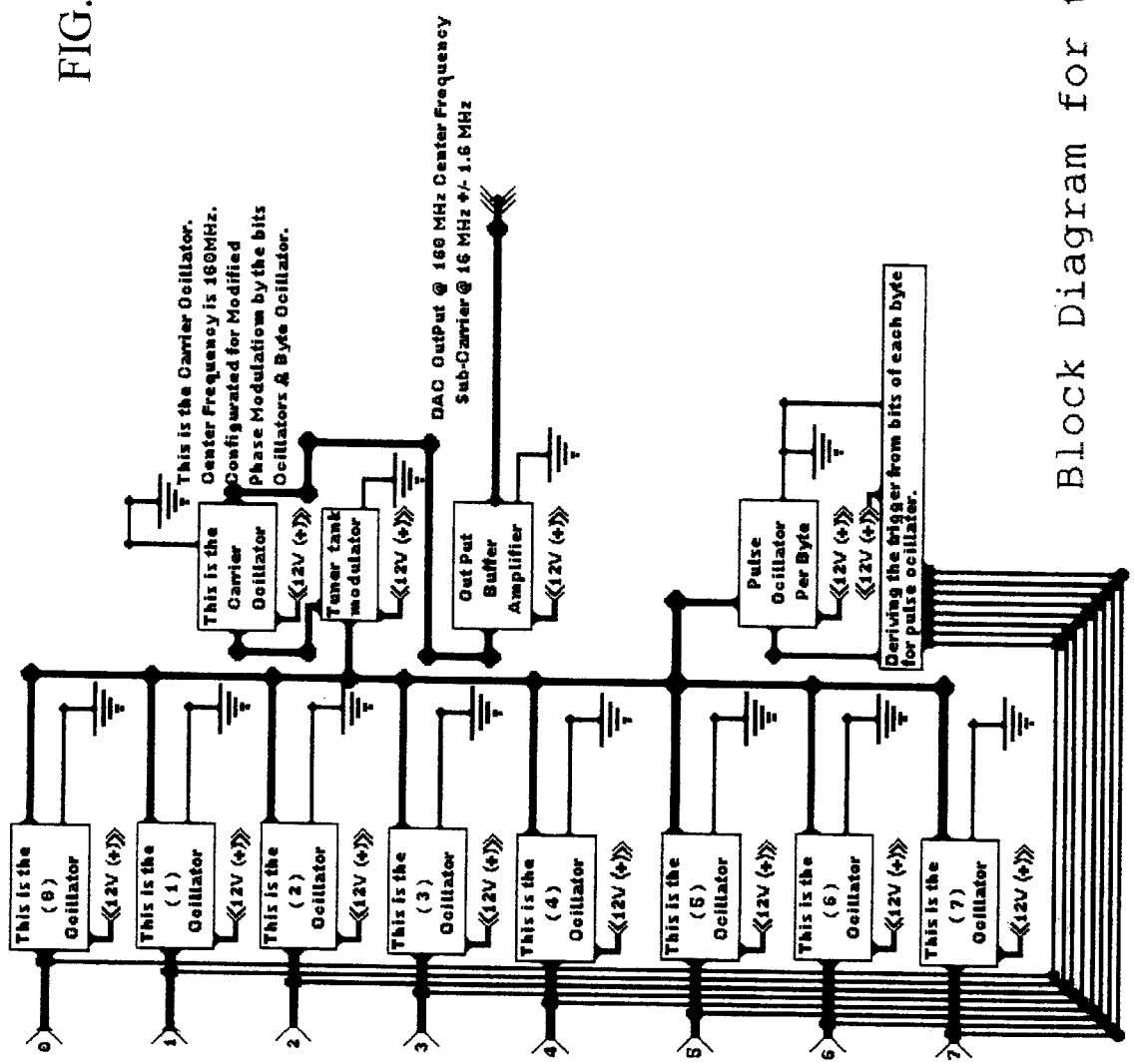

DACTRANS MATCHCADO

CROSS-REFERENCE TO A RELATED APPLICATION

This application claims priority to U.S. Provisional Patent Application Ser. No. 60/074,137, filed Feb. 9, 1998, which is herein incorporated by reference in its entirety.

BACKGROUND OF THE INVENTION

Solid-state Electronic Computer Communication involves accurately acquiring and converting digital data elements into unique analog symbols and back again from analog into Digital Data correctly, from locations near or far (CPU & Memory) on or off motherboard by one wire above ground at low cost and at very high frequencies/super high frequencies (VHF/SHF). The transfer of data in bytes per second for the subject device is 4 mega bytes at 100% correct stored data. This is for copper wire systems and much greater speeds are obtainable when used in other application formats, e.g. wireless, microwave, radio telemetry, laser, laser diodes, light emitting diodes and any other form of RF carrier conduit.

The state of the art in computer communications, known as Baud Rates, was 300, 600. 900, and 1200, with greater speed ascertainable beyond 4800 bits per second. These Baud Rates were slowing the computer and still do today. The Federal Communication Commission (FCC) was being disagreeable about the use of bits as an atom element. The FCC perceived that a bit was not an intelligible part of communication operations. It also contended that a bit was not another form of a character or a symbol. A serial bit stream could be used to form a character or symbol, being an intelligible element, when considered as a single pattern. In the truest meaning, it does take 5, 6, 7 or more bits to represent any one character for the human intellect to perceive. The same is not true for all intellects such as created for computing machines, called digital-logic. Many computers do have sensing arrays that may need only a single bit, {to be on or off}, in order to know or sense the correctness for proper operation.

QUAD Ltd. of the United Kingdom being patented in 1967 under the English patent standards. They nicknamed this predecessor circuit, "current dumping". In terms of engineering it was called 'FEED FORWARD CURRENT'. Under QUAD style of this circuit, it performed faithfully for signwaves right out to 200 cps and trianglewave at approximately one-half that frequency, although, squarewaves brought in 12.5 k cycles per second as a maximum frequency. The state of technology throughout the thirty years had not improved the above characteristic even into extremely low resistance, for example less than one ohm, at multiply reactive component impedance (multiply reactive is any value of both compactive and inductive reactants). This largely makes the usefulness of current dumping relevant only to the audio frequency bandwidth, and even not when required to do squarewaves in audio sounds.

'FEED FORWARD CURRENT CIRCUITRY' was introduced in mid year of 1998 by Analog Devices Inc. They have developed this circuitry into moderately high frequency, "VHF", operational amplifiers which notable are able to handle signals that cause the output wave form to come within $2/10$ of a volt of both positive and negative power supply voltages, while managing a noise of is $1/1,000,000$ the level of the output signal.

Previous beta configuration transistor circuits have a flaw that causes the gain of the circuit to roll off inversely proportional to the frequency. Due to the inherent capacitance of the collector to base reverse bias diode junction. Although, this capacitance is offset by the inherent capacitance of the forward bias diode comprised by the base to the emitter junction, being made somewhat a smaller value by this second diode in relationship to the 'hfe of the transistor. This is because of it's inversely proportioned by the gain know as the 'hfe' of the transistor. In the beta configuration, the collector circuit is always 180 degrees out of phase with respect to the input signwave. The emitter circuit is in phase with respect to the signwave. Under Ohm's Law capacity reactives, is inversely proportional to the frequency. Therefore, as the frequency rises within a transistor beta configuration circuit, the output signal is shunted into the input signal at values that are inversely proportional to the frequency. Thereby being added together with ([C of cb, plus {C of be and C of 1/cb}] times "hfe"). This causes a real gain roll off and therefore, the transistor effectively does not amplify after a certain limit. This is know as alpha cut off. In summing up, beta configured transistors, radio waves used from the VHF spectrum and through out near light RF spectrum, require very special and costly semi-conductor designed and manufacturing processes. Please refer to 'Old Beta' Diagram (FIG. 5).

BRIEF SUMMARY OF THE INVENTION

The subject invention relates to a device utilizing common market digital to analog converter and analog to digital converter which has to be excessively tuned to make up for the inherent inaccuracies that the DAC into ADC in order to get correct conversion of digital to analog and this analog back into correct digital parallel bit pattern. This DAC-TRANS MATCHCADO utilizes feed forward current and multiply phase modulation of the carrier as a means to recognize the correct bit states. The DAC CADO units interpose for the DAC ADC causes the unit to be simpler in tuning and the feed forward current makes the buffer oscillators have true and correct Signwave values.

To best understand and envision this process within the mind, we will relate the analog carrier wave form as a symbol to the constellations. Like the Orion constellation plotting the peaks of wave forms on a two dimensional graph, having 'x' and 'y' axis, with point rather than wave lines, makes this appear as if you were looking at a star chart. The 'x' represents relative amplitude and the 'y' axis represents relative degrees within each character dimension. Looking at the explanation of functionality for a 33.6 k bit modem through 56.7 k bit modem, they are to be compared by array of bit points as constellations.

These peripherals now look at these bit-points one at a time. For example, Alpha Ursa Major is the most Northern star going North to South and Beta Ursa Major is second, to state a few, however, when we study the constellations we are looking at them individually, not as a group. The subject device looks at all the bit-points, as one individual consecutively, much the same way we humans look at the star constellations. Examples of this is Cassia Oppia is running from Dracos, who is trying to eat her, as he pours out of the 'Big Dipper' {know as Ursa (Bear) major} while she is trying to run around the 'Little Dipper' {know as Ursa (Bear) minor}. However, when we look up at these we see the 'Big Dipper and the 'Little Dipper' as a whole.

To further explain the difference between how the subject device uses the resources available to how the existing devices use the system, we will go back to the examples of the constellations. When studying the stars, we use a telescope to see the individual stars we do not require the use of a telescope, to enjoy the view. In the same way, the existing devices require the use of the Central Processing Unit to evaluate the individual points and my device does not use the CPU or other system resources for this evaluation.

The development of this communication device came about in many stages. The first was to setup true and correction elements for the most known character symbols and being able to duplicate all possible symbols correctly. Taking lead from Intel, Texas Instruments (TI), and then later Motorola, the subject invention utilizes simple sub-circuits for each of the bits allowing them to link in a daisy chain fashion. These daisy chain links are based on the examples of the so-called half byte (Hex) processor, which would link with other Hex processor unit(s) forming a (whole) byte, word, and double byte, etc processor's. Such are these functioning machines as 8 bit computer, 16 bit computer, etc. Linking these machines can provide almost unlimited number of bits per data element. The latest example of various parallel-bit wise data elements are 32, 64, and 128 bit data element game machines. It is important to be able to parallel read each bit correctly and convert them into combinable symbolic wave, that forms a single analog symbol, which can be called constellations. Each constellation must be deciphered correctly into parallel bit patterns that are equal to the original parallel bit pattern used in the beginning of the input cycle of the communication machine.

'FEED FORWARD CURRENT LOOP TECHNOLOGY' is the ability to operate at frequency thresholds beyond 40 tera-cycles per second, the normal paradyne of modern circuits in transistor designs. Common belief is that 40 tera-Hertz is an unreachable limit. Now, we just simply described the path of current through input to output while maintaining the highest level of signal to noise ratio, maximum power efficiency, and having peak to peak output swing voltage equally positive most to the negative most power supply rail voltages. While being able to drive this circuits input at levels equaling 50% of the power supplies rail to rail voltages, the circuit will maintain a noise of $\frac{1}{1,000,000}$ the output value.

BRIEF DESCRIPTION OF THE DRAWINGS

FIG. 2 illustrates a Q-point variation line showing the inherent linearity instability of a standard transistor configuration.

FIG. 7 shows the data elements which correspond to the sine wave sequence shown in FIG. 6.

FIG. 13 shows a block diagram of a digital-to-analog converter in accordance with the subject invention.

DETAILED DISCLOSURE OF THE INVENTION

Figure 1:
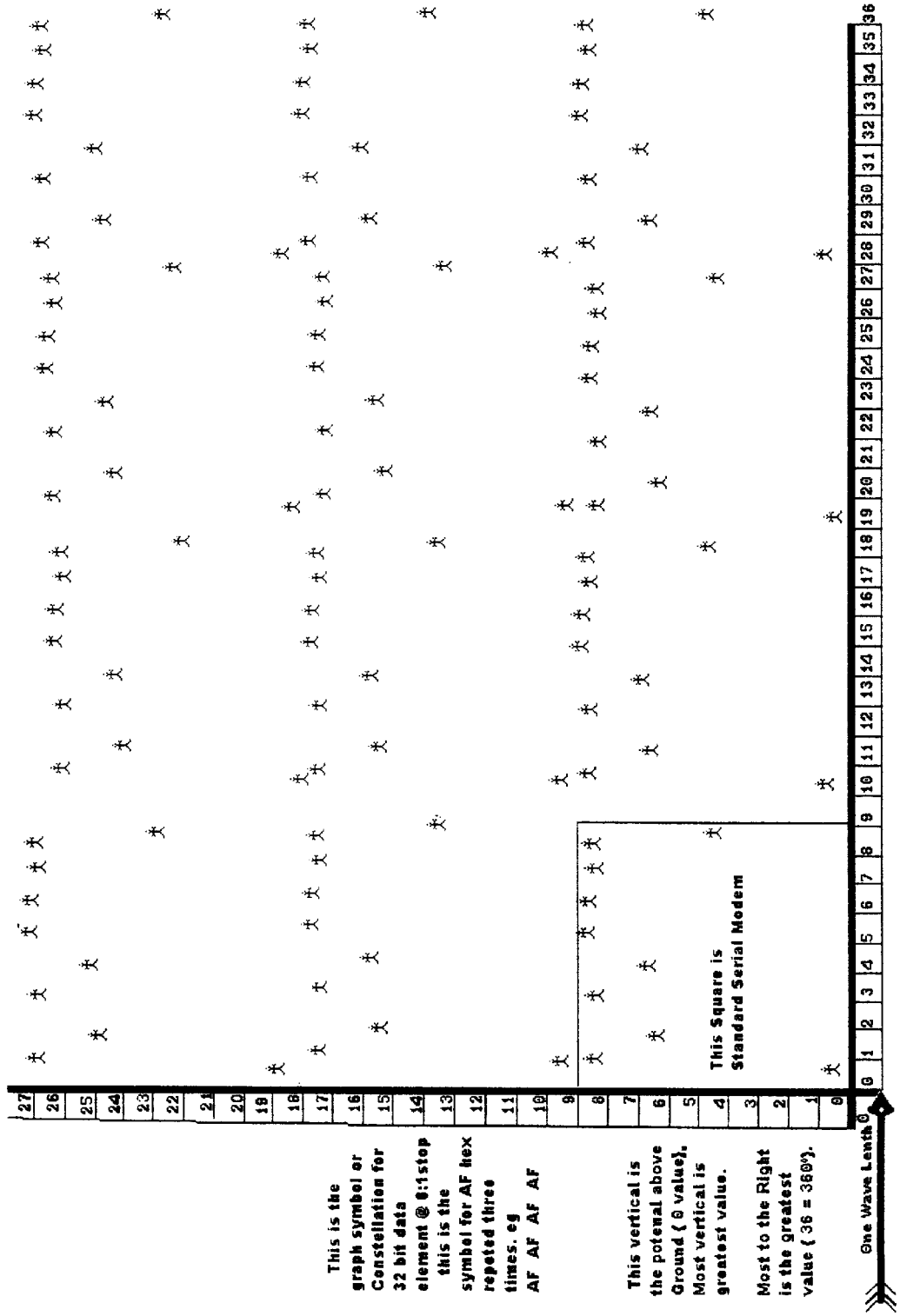
FIG. 1 illustrates a comparison between the prior art serial chain communication devices and the subject parallel chain communication device.
Figure 3:
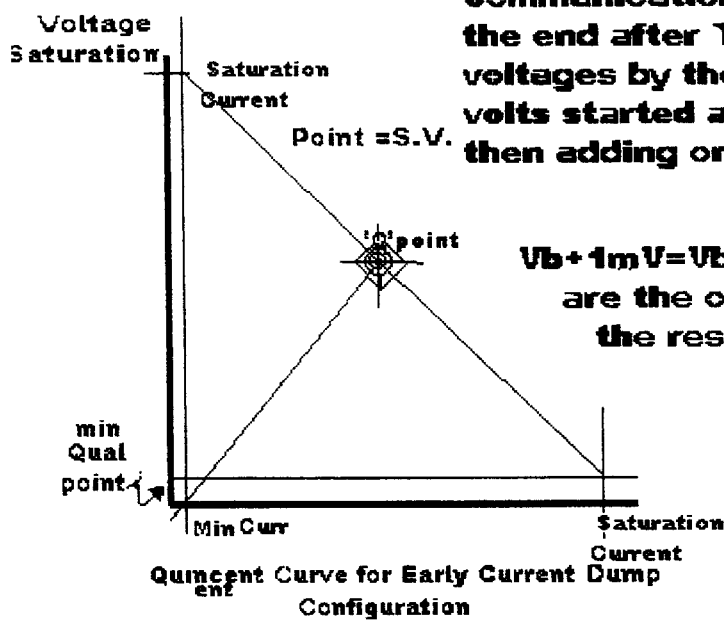
FIG. 3 illustrates a Q-point variation line for a corrected fee forward current configuration.
Figure 4:
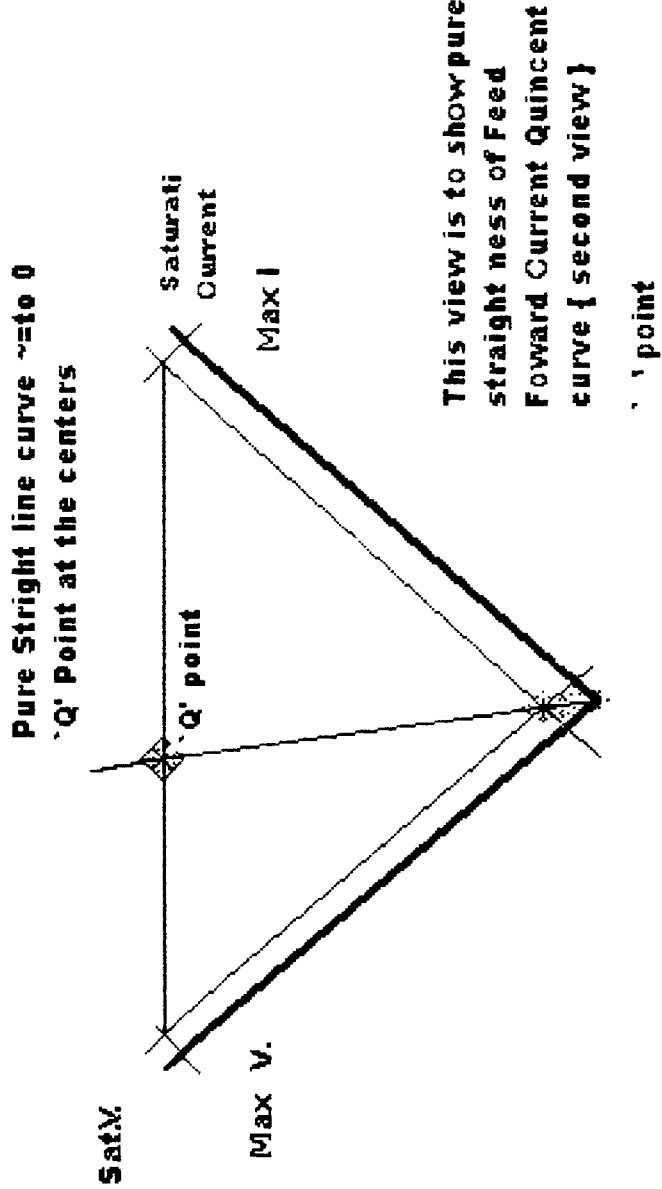
FIG. 4 illustrates another view of a Q-point variation line for a corrected feed forward current configuration.
Figure 5:
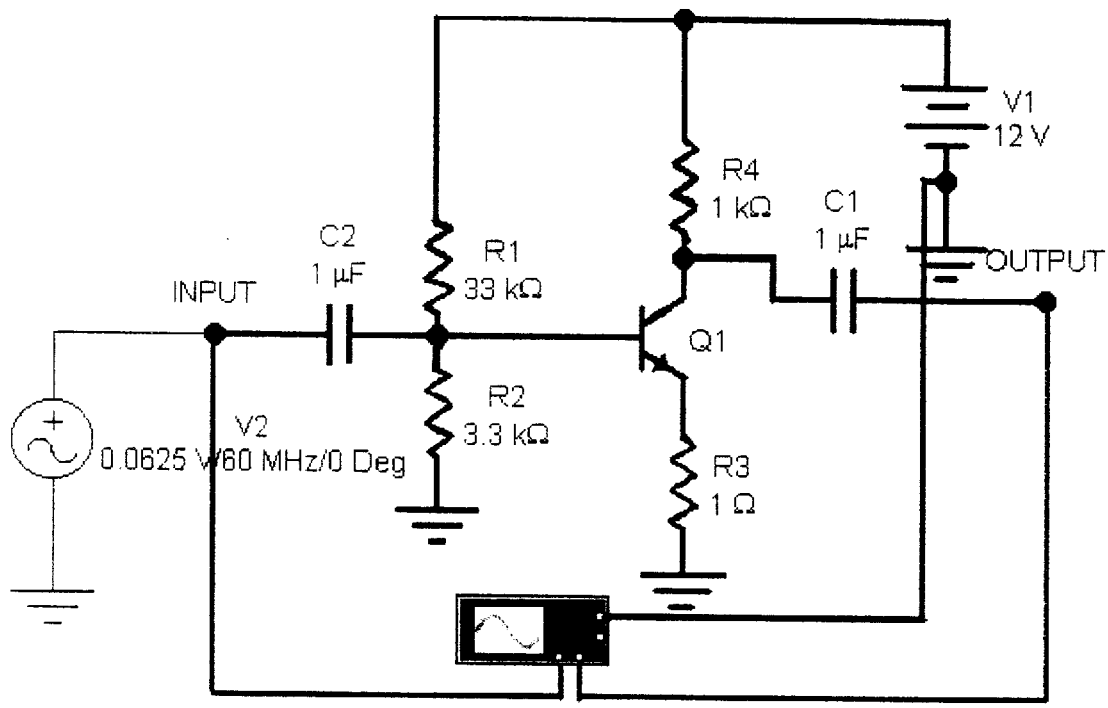
FIG. 5 illustrates a prior art transistor circuit which does not use feed forward current and produces Q-point variation lines similar to those shown in FIG. 2.
Figure 6:
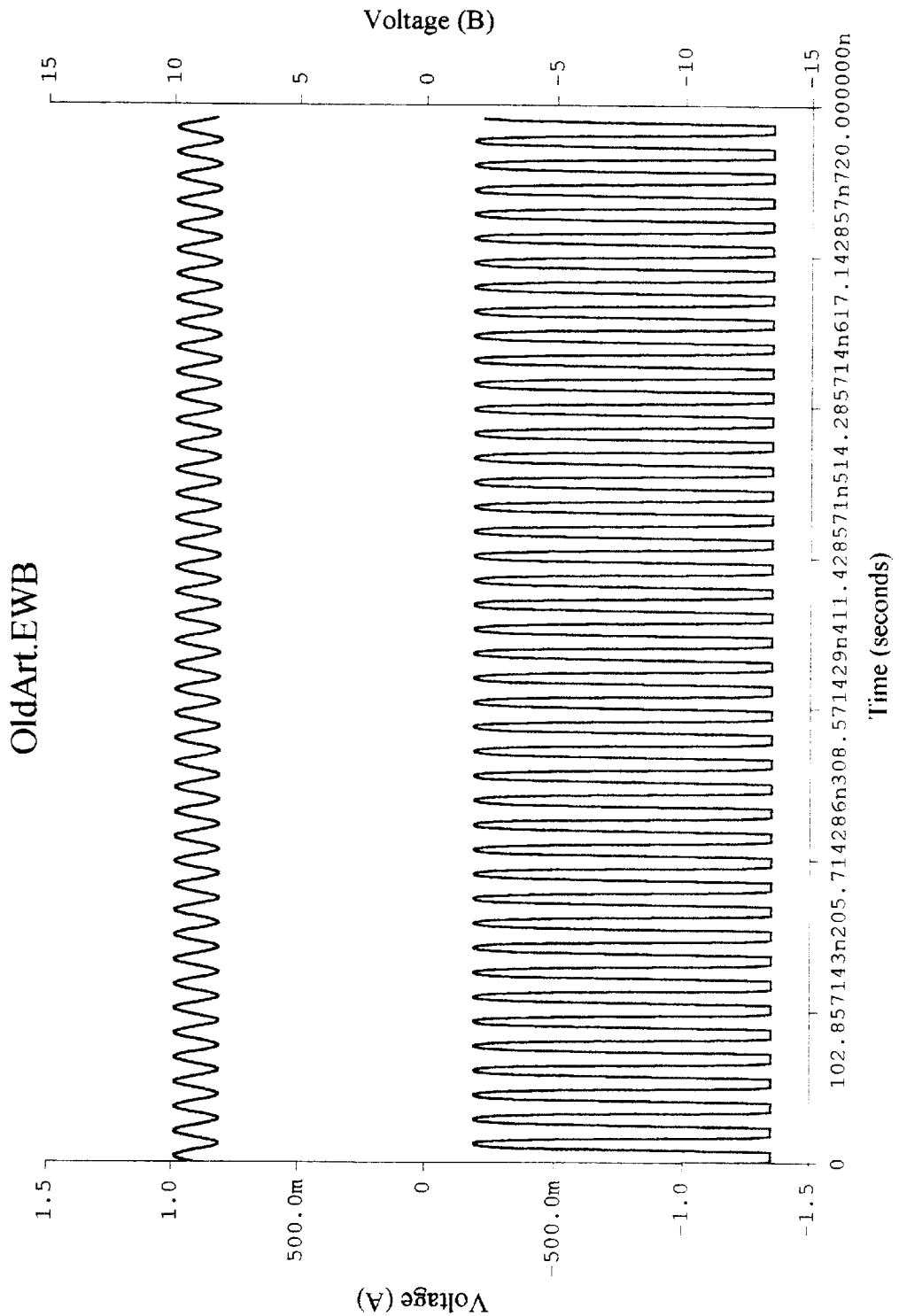
FIG. 6 illustrates a sine wave sequence for the transistor circuit shown in FIG. 5.

The two transistors with the same part number, one being configured in alpha characteristics and the other in beta characteristics, having both configuration inputs commonly connected. This divides the input equally between the two configurations, causing an inverse and non inverse quincent gain curve to be mathematically equal to 1 sub characteristic curve causing the combined quincent gain curve to be in the worst case, a mere slight curve. For all practical points along this combined quincent gain curve, this makes it equal to an ideal quincent stratum line curve. In essence, removing all the natural anomalies that are natural to and largely the reason for the various transistor part numbers in existence today.

This dual configuration is used instead of any single bi-polar transistors position that is represented by the single PNP or NPN icon or combination PNP/NPN icons. It can be represented by a single icon being lettered "idealized".

The first two phases of the development are a digital to analog converter unit and an analog to digital converter unit. The third phase of the development is the Trans Modulation to lower and to higher frequency. The fourth phase of the development is the inverse Modulation of back to higher and back to lower. The fifth phase of the development is to include connection to other communication apparatus' not being limited to light diodes' and laser diodes' and lasers.

With respect to Digital to Analog conversion as a modular device, Phase Frequency modulation performs the best at both narrow bandwidth and required selectivity. This selectivity would be part of analog to digital conversions unit, which assured correct bit on or off at the appropriate positioning for each of the data bits happening when the conversions returns to parallel digital signals. Although Amplitude Modulation worked well and is included in the development, the noises by interference did not insure correct bit on or off for the proper bit position at all the possible interference's. The side-bands, upper & /or lower, did do very well at both band width and selectivity. This method does require more circuitry, making it more costly to manufacture, yet not overly expensive.

The next two phases were to development and set up the most appropriate loading devices. This loading device can be called a "Trans-Matching Device", that is for the purpose of load matching and load buffering to shield the modulation unit(s) and to shield the demodulation unit(s).

The number of stages is mostly dependent on the maximum differences between the modulator to load line frequencies. An example of this is, if the chosen frequency for the modulation is 100 MHZ and the chosen load line frequency is 2 kHz. Normally, steps of more than 10 to 1 are not a good design methodology. Therefore, if you divided by 10 repeatedly until you have arrived at the desired load line frequency. As in this example below you would divide by 10 until the last step would overly do the division then the last step division would then only be divided by 5: as Intermediate Frequencies Stepping 100 MHZ/10=10 MHZ/10=1 MHZ/10=100 kHz/10=10 kHz & 10 kHz/10=10 kHz/5=2 kHz now 100 MHZ to 2 kHz is negotiated.

The reversed operation is for covering the difference between load line frequency and the desired demodulation frequency. It is almost always best to use the same stepping sequences as was done in matching modulator to load line, as we have described above for example: an Intermediate Frequencies Stepping operations. 2 kHz * 5=10 kHz * 10=100 kHz * 10=1 MHZ * 10=10 MHZ and * 10=100 MHZ.

This stage is meant to help connect other apparatus such as lasers, laser diodes, sound, and etc. With connecting to other apparatus one is able to transmit data through space and materials without the use of wires.

DEFINITIONS

Alpha Configuration
  is when the input signal drives the emitter and the common element, the base, while the output is taken from the collector and the base.

Beta Configuration
  through two different methods, as follows

Common Emitter
  is when the input signal drives the base and the common element, the emitter, while the output is taken from both the collector and the emitter.

Common Collector
  is when the input signal drives the base and common element, the collector, while the output is taken from both the emitter and the collector. X times 1/X=1 where X/1=beta configuration and 1/X=alpha configuration.

Quincent Gain Curve
  the Q line as plotted from the right angles of both voltage maximum and current maximum applied to a transconductive unit, such as commonly called transistors, being normally non-linear with respect to linear changes of the input into transistor circuits. As example, but not limited to this example, 1 mV change in the input, then equals 55 mV change of the output. Then a 2 mV. change in the input would then equal 100 mV. change of the output. The first part of this example of the quincent gain curve is a 55 to 1 ratio and the second part of this example is only 50 to 1. While the next mila Volt change (3 mV.), might give us 170 mV. difference as an output, giving us a 56.6 to 1 ratio. This is true for beta configurations, while the mathematical inverse is also true for the alpha configurations.

Figure 8:
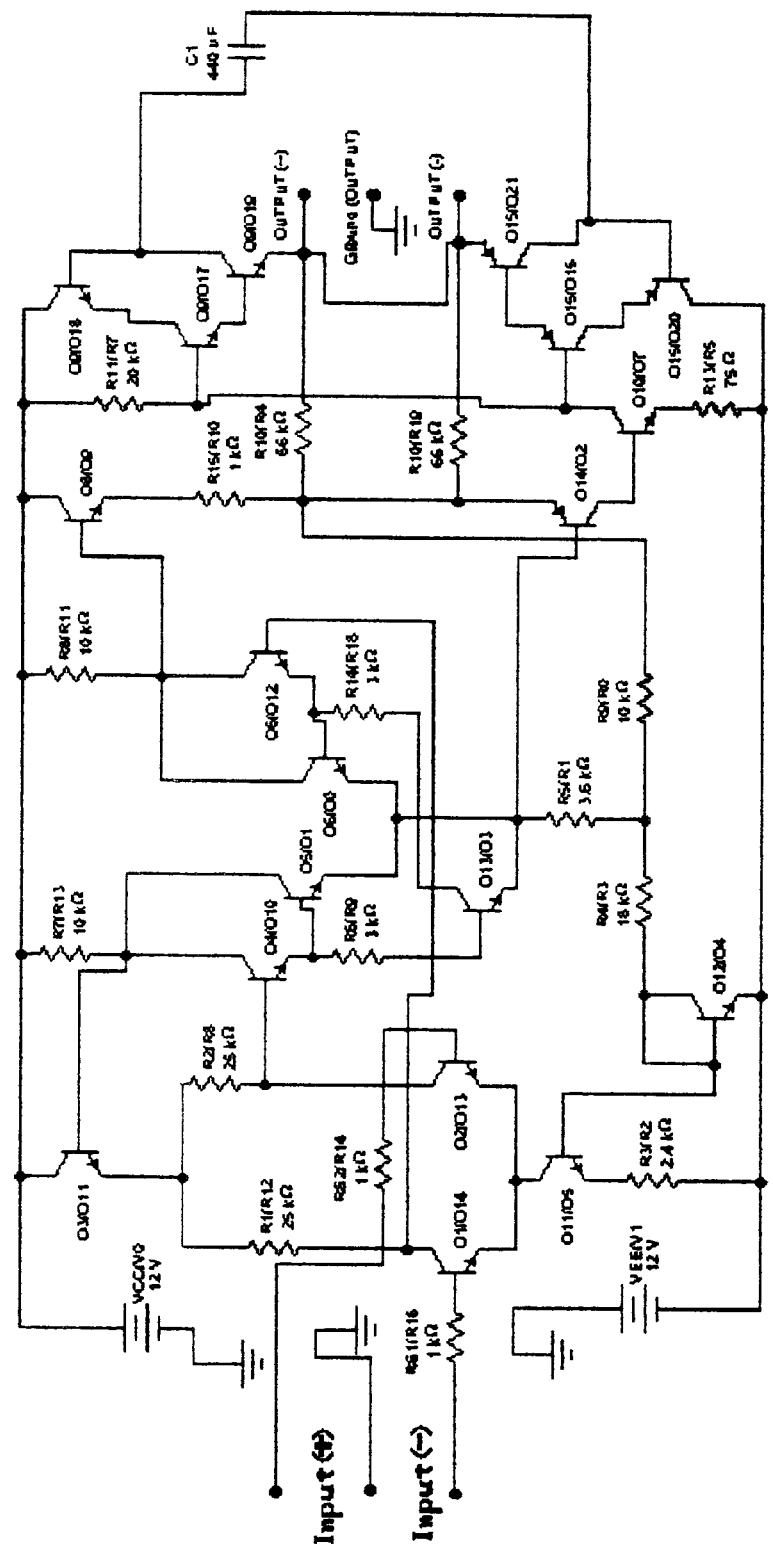
FIG. 8 illustrates an Op-Amp circuit in accordance with the subject invention.
Figure 9:
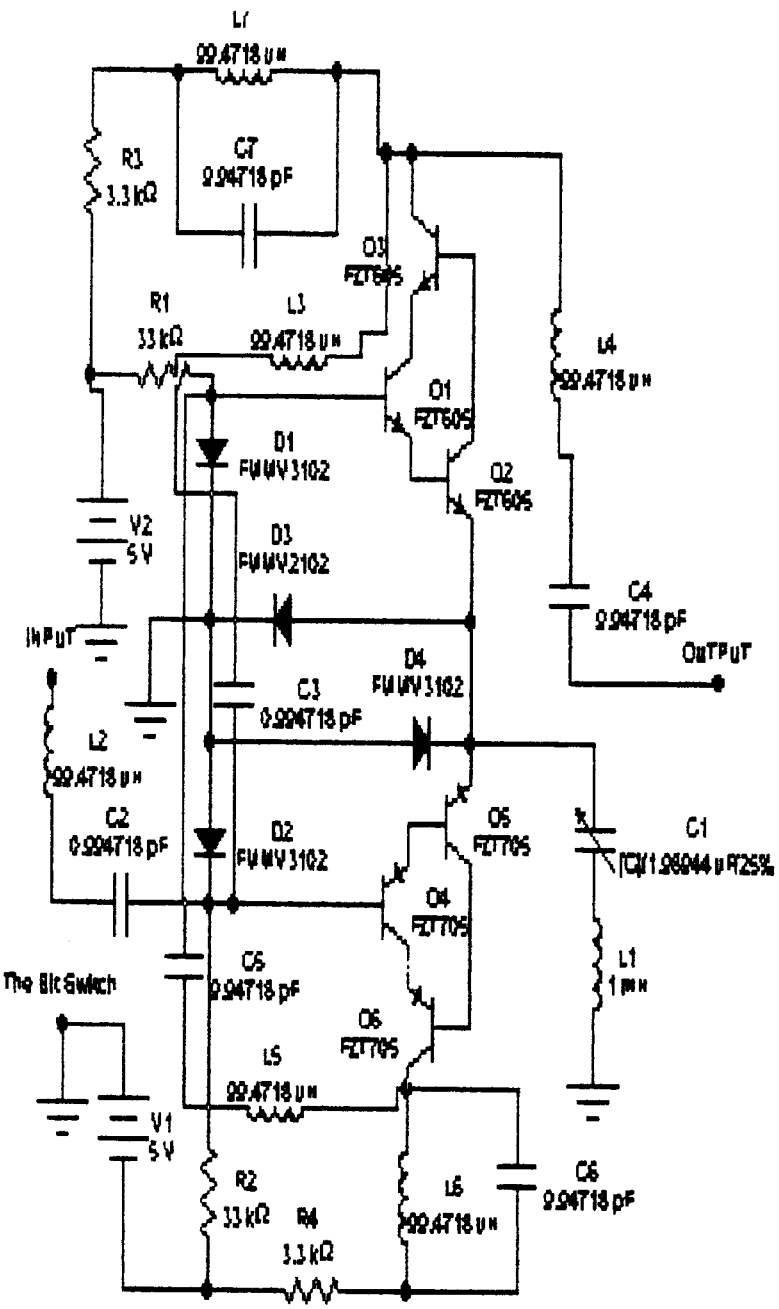
FIG. 9 illustrates a bit switch in accordance with the subject invention.
Figure 10:
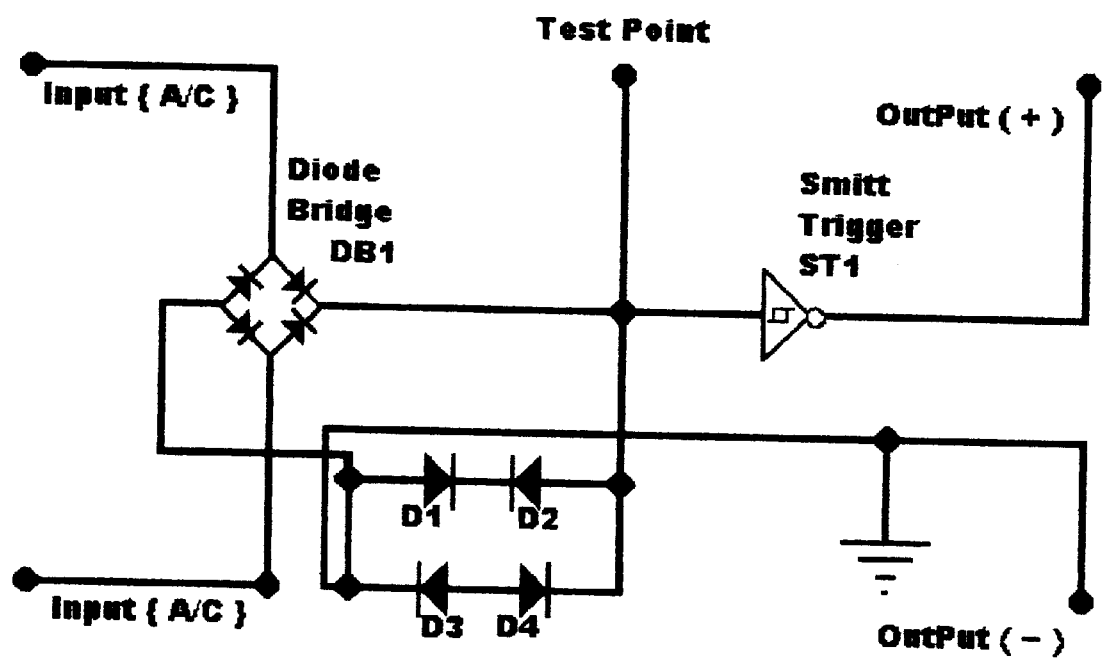
FIG. 10 illustrates an auto-clock in accordance withe the subject invention.
Figure 11:
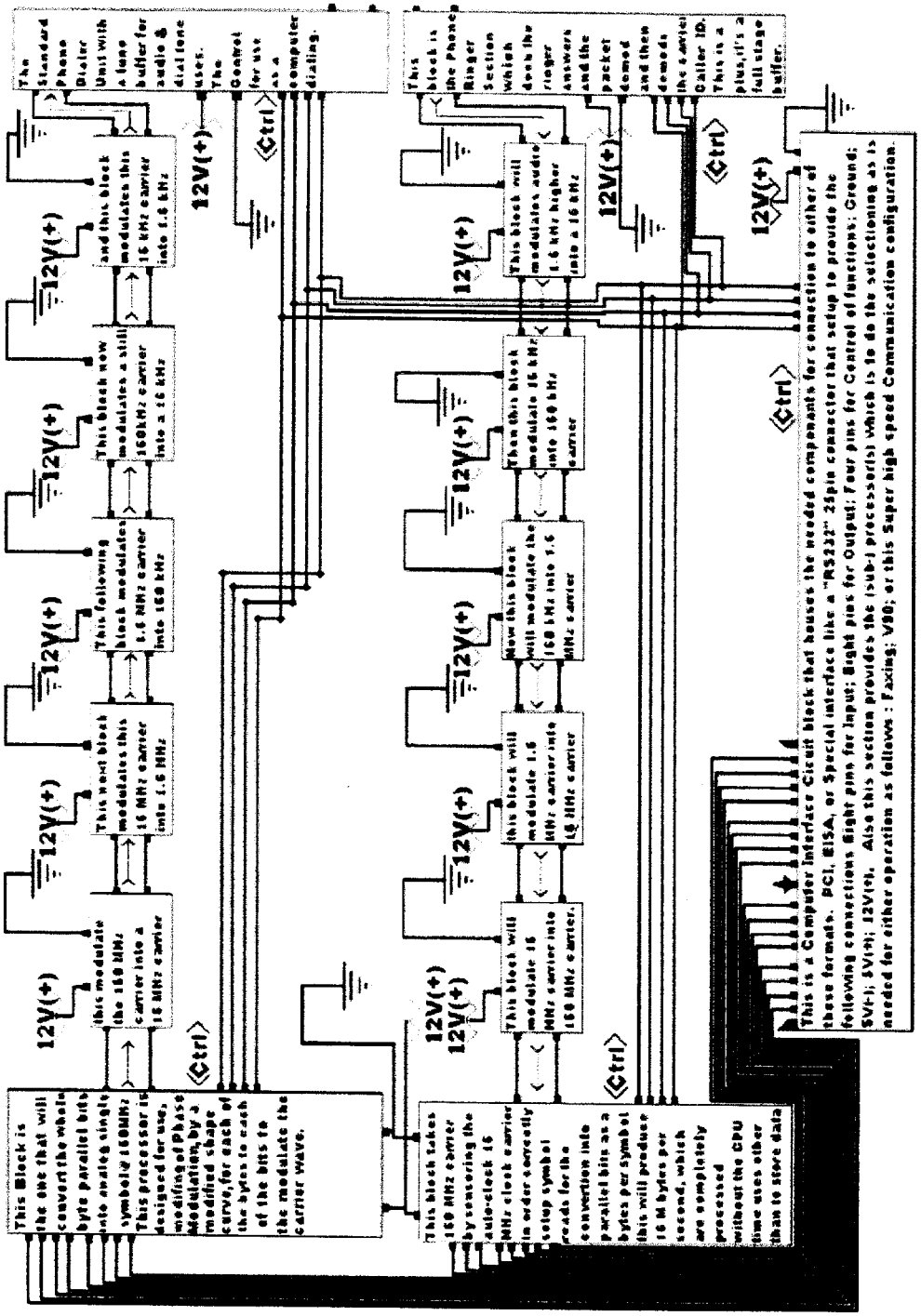
FIG. 11 illustrates a device for transmatching a digital-to-analog converter to other devices and transmatching other devices to an analog-to-digital converter.
Figure 12:
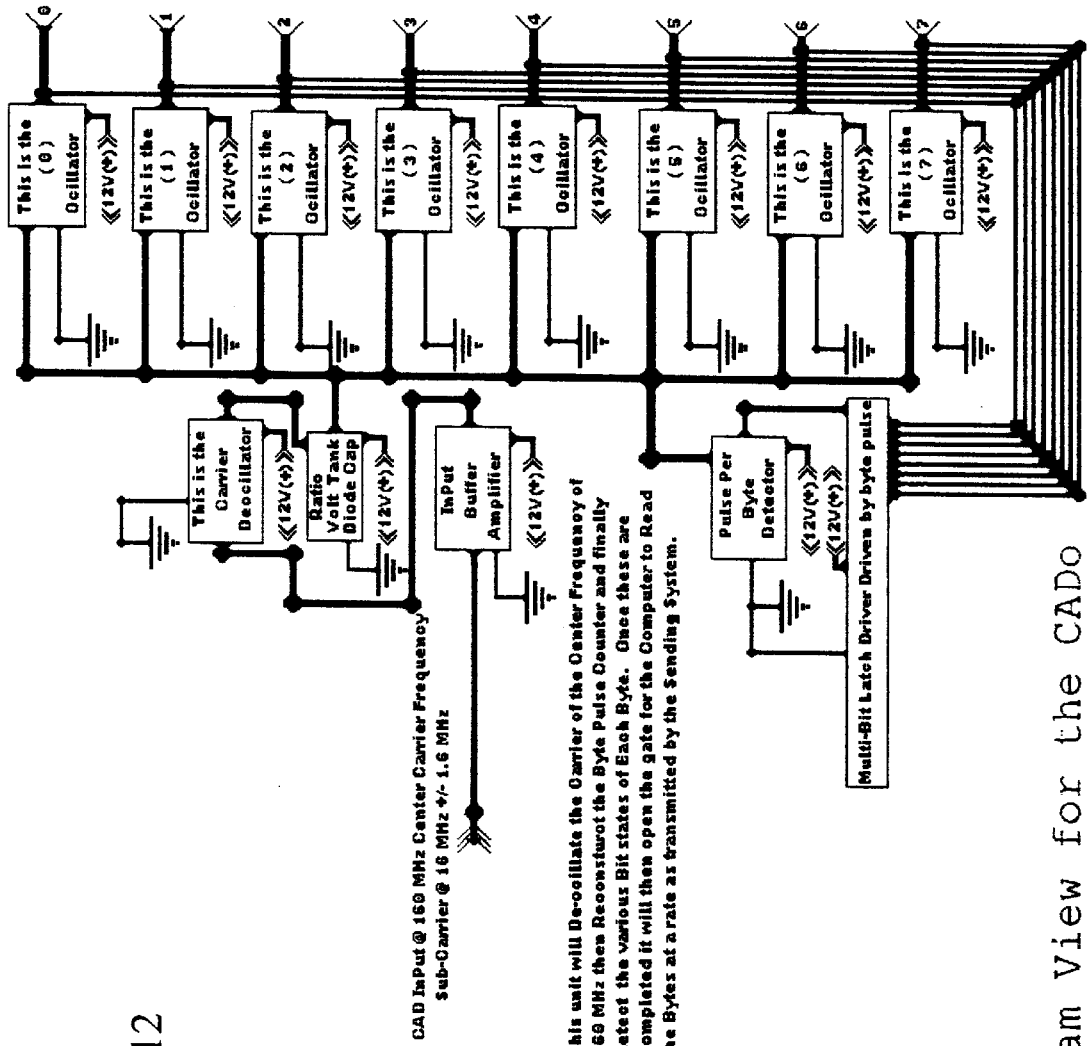
FIG. 12 shows a block diagram of an analog-to-digital converter in accordance with the subject invention.

Referring to FIG. 8, the subject new beta configuration utilizes three transistors in quasi beta, alpha, beta configuration. This configuration sets up a truly transit current oscillation that is modulated and represents the transistor typical 'hfe' forward current gain for the input to output. These are equal in the type of transistors used in triplicate form, utilizing the gain of the other two transistors in such a way that it multiplies the inherent capacitance inversely proportional to the additive 'hfe'. Essentially, this circuit configuration has the forward gain of any one of the transistor trio. The normal characteristics of the present day single transistor is not symmetrical, however with the improvements of the subject invention this transistor trio compliment, mirrors each other forming a ideal amplified wave form as an output. This causes a softening of the normal output limiting by any single transistor, avoiding chopping or clipping (square-waving) which is usually present in a single transistor amplifier.

The design characteristics of this tri-transistor amplifier finalized as a complete connection with modified operation amplifier design. This unit is able to self regulate itself in order to drive every format of a virtual short circuit, resistance, inductive, and capacitance, and any and all before mentioned configurations. Also, the unit is able to drive infinite resistance, inductance and capacitance without circuit configuration change or part variations. Requiring only one circuit design to drive both short and infinite loads. While having the greatest efficiency rating at each of the previous requirements. Yet still providing purest reproduction of input signal. Where ever the input Signaloid Signwave, Trianglewave, Squarewave, Compound wave, Complex wave as an ideal waveform being kept throughout the circuit.

Because the configuration of the transistor trio compliment, the output path is serially run through each of the transistors representative capacitive value meaning the effect as displayed by Ohm's law as the additive of the inverse of these capacitance's inverted. This effective capacitive reactants value is diminished by ($\frac{1}{3}$)/'hfe', thereby increasing the alpha cut-off frequency. This means that a cheaper grade of transistor can now run at 3 * times the 'hfe' it's original alpha cut-off, while having the purest, possible recreation of input wave form than the more expensive transistor would normally be able to reproduce at the chosen frequency. Please refer to 'New Beta' Diagram (FIG. 8). Other than the final stages, as shown in FIG. 8, a typical operational amplifier contains all of the circuits in detail. The coupling of a current dumping feed forward current circuit to the operational amplifier is known, turning the operational amplifier into a feed forward current amplifier. Although these are of limited use around 140 Khz as a center of frequency for operations. On the extreme right hand side of FIG. 8, a coupling capacitor is coupled to the feed forward current circuit, in order to cross feed the variations between the negative wave form control and the positive wave form control. Coupling at a point that is con-gerent with the feed forward current 'hfe'. This, effectively, changes the feed forward current, negative and positive, to track the Xc's linearity's frequency component. Permitting this circuit inherent linear amplifications limited center band width to be relocated to design criteria center frequency. These frequencies can be ranged through out the super high frequency round and anywhere it's natural location and 'shf'.

The auto proportioning is really a function of soft limiting so that as class-A gain approaches clipping limits, the current feed forward being a Constance between the second pair of this trio transistor amplifier. As the input voltage approaches the thirty percent of maximum VCC to VDD then the circuitry begins to function in a logarithmic gradually increasing via an inverse proportion related to the difference of the first transistors 'hfe' and the combined 'hfe' of the second pair of this diode trio transistor amplifier. The end result of this logarithmic function of diminished gain permits input signals to equal 70.71 percent of the combined VCC/VDD voltage difference.

Functionality of this new breed of amplifier the tri-transistor configuration is a class-A though Class-B and even into Class 'C' amplifier level with minimal wave form distortion, by virtue of this circuit's ability to diminish gain internally by auto proportion. Beginning from the input signal through the biasing circuits to the first transition circuit to the input of the bi-modulating transition circuit, yielding the output of this amplifier.

An input wave form being either pure signaloid, trianglewave, and/or squarewave applied to the input location 0.00 through 10 microfarad. Location 0.01 causes a power limitation restricting dc modulation to between the location 0.01 and location 0.02. Location 0.02 is the converting point of diode chain Rb 1 and Rb 2 which is the bios modulation for the input of first stage through last stages of the amplifier. These diode chains are acceptable for ultra high frequencies throughout power line frequencies. These diodes can be selected for $1/10^{th}$ frequency as a means to maximize cost effectiveness. Location 0.03 is a resistance value selected to lead off the Dc biasing that is begun from this location 0.03 and location 0.04 being the first of the diode chain through location 0.18 which is know as Rb 1. It is also connected at location 0.02 to diode chain of location 0.19 and location 0.20 to ground location 0.42. Location 0.02 to location 0.21 (base) of Q3 is the beginning of transition modulation, first stage.

Transition modulation is the power gain factor know as 'hfe' times the dc modulated input forming equal, yet opposite in phase to output signals. The first, positive most signal is the dc modulation of Rc 1 dc bias formed by the combined location 0.03, location 0.22, location V1(+) through diode chain location 0.23, location 0.36 into location 0.37. The location 0.37 is the dc modulation also of location 0.38 Rc 1 of Q3 that finally is the dc modulated output signal of the amplifier. Location 0.21 Re 1 to location 0.39 is the sub control modulation signal for the dual trans modulation alpha to beta of location 0.38, location 0.41. This forms a negative bias at location 0.40 as an inter-modulating negative signal corresponding interlock gain of Q2 (location 0.38), Q1 (location 0.41).

Output dc bias signal (location 0.37) is now ready for inter-connection to the next amplifier stage. Output signal will drive output resistance values as low as 0.001 Ohms' to a maximum resistance to 1000 Ohms' having any value of inductive reactants and any practical of compactive reactives with respect to all normal load variations fully including to virtual impractical size elements. V1 is the power supply source connection positive at location 0.22 and a negative at location 0.42 ground normalized voltage value being chose for the amplifiers most efficient parameters.

Control modulation is the regulation of a transistor's natural affinity to overload itself in a catastrophic manner. The disastrous nature of the transistors to conduct increased current while expanded with heat causing even more current to flow. This leads to melt-down of junction doping throughout the transistors sub stratum materials. For example, base material impurities migrates into the collector sub stratum and into emitter sub stratum materials. Also, the impurities of both collector and emitter sub stratum materials migrate into the base that effectively causes the transistors to be non junction single bodied semi-conductor having no junction at all. This, at least, varies the scourged weak junction diodes into a very weak active transition device. This means that the transistor is no longer able to function as an electronic variable trans-conductance.

Pioneer Electronics of Japan first used diodes in series with the collector circuit for the high power amplifier section as a means to create a rectification of signal feed back as a means to limit this through the power supply to lower powered extremely high gain circuits.

Thorough testing of this phenomenon called the Zener effect showed that it was not the diodes rectification but the near constant voltage drop of common diodes. This was the reason for the optimal use of diodes in the high current path of power amplifiers. When used within the high current path of these amplifiers, they also inter-acted with the collector base junctions of these high power resistors forming very smooth active trans-conductance within the transistors and these added diodes.

Diodes having a near fixed voltage drop across them, in forward bias, could easily be used to replace the near constant resistance elements know as resistors. These diode chains serve as current limiting and as active reaction elements for trans-conductance in transistor amplifiers. An added benefit to this is that chip manufactures can more easily produce chip sets utilizing already standard procedures of making diodes rather than resistance bridge of semi-conductor stratum.

The above mentioned paragraph does infer that the trans-conductance within transistor amplifiers can be shared among the diodes, inside the collective, base, emitter circuits. This sharing also distributes the heat generated, normally within the transistor, when not using diodes. It is true that these external diodes do heat up and add to the eventual catastrophic melt-down. However, the circuits can be set with diodes in the input circuit in such a way as to off set both transistor and diode thermal runaways, due to the heat generated. The gain of the use of these diodes softens trans-conductance and puts the transistor amplifier into virtual resistance ratio rather than the hard core fixed resistance setting of modern day resistors. There are present day diodes that do inhibit the thermal runaway by actually increasing forward bias resistance as the temperature rises. This makes these reverse thermal character diodes most desirable for extremely high current or extrinsious low load value circuits. The application of these diodes in modem transistor circuits forms and creates cleaner signal amplification and absorbs by readjusting the circuit parameters, in effect, cooling the amplifiers characteristics thereby avoiding thermal runaway and thermal non-linearity's that are so characteristics of modem transistor amplifier circuits. This is evident by the cleaner sounding very high quality vacuum tube amplifiers still being sold today.

A specific embodiment of the subject invention, referred to as the DACTRANS MATCHCADO, is composed in modular units varying externally each of these units to perform the particular task at hand for those modules. The basis of each module is a single Class A optimize for linearity and low power consumption being loaded by tri-transistor feed forward loop oscillator amplifier. This permits the Class A amplifier to be truly optimized and remains in this state, no matter what configuration the module ends up being.

VCC of FIG. #1 is coupled to a parallel inductor and capacitor chosen to be resident at the desired oscillation frequency. While the input is feed forward tuned from the VDD, emitter, by either method called the inventor name; Heartley, Colepitz, Simpson, Pierce-Simpson, or modified Colepitz-Simpson Quartz; Oscillator. This completes the selectivity of this, the carrier oscillator as follows. At the connection of VDD, grounded, or to power supply negative pole, is connected through a trap series tuned circuit having an inductor and capacitor chosen for residence at the desired frequency with as low a resistance as possible that is paralleling the capacitor.

The below described Phase-Shift Sub-Oscillator is to parallel with above paragraphs last sentence description of the serial trap selectivity circuit as follows. Phase-Shift Sub-Oscillator is the connection of this amplifiers VCC to the VDD of the Carrier Oscillator as mention in the above paragraph. At the connection of VDD, is grounded, or to power supply negative pole, is connected through a trap series tuned circuit having an inductor and capacitor chosen for residence at the desired frequency with as low a resistance as possible that is paralleling the capacitor.

The amplifier VCC to power supply plus is connected through parallel a tank circuit to the frequency of data byte relevant frequency, e.g. bytes per second. The VDD to ground or power supply negative through series tuned trap circuit at bytes per second. Output through series tuned trap circuit at bytes per second, connecting to carrier amplifier oscillator output.

Input of this amplifier is tuned for the desired carrier frequency by the resident trap circuit. The Hedradyne tuned circuit is a tuned trap connecting between VCC and input paralleling RB1 diode chain having a selective unit also Hedradyne frequency tuned trap output to input. VCC is connected through the parallel to the tank circuit tuned for the difference frequency connecting this tank circuit to the power supply positive. VDD is connected through a series tuned trap, also tuned at the difference frequency is then connected to ground or power supply negative. Output is feed through a series tuned trap that is tuned at the difference frequency making this into the new carrier frequency. This is repeated for every stage of intermediate frequency necessary to fulfill compliance use. See statement above at Third Stage (Development of Trans-Modulation).

Multiplication of a sub carrier frequency to a higher frequency is normally a tricky situation, at best, the utmost care at correct clocking of frequencies involved. Input is tuned at sub {lower} frequency by a trap resident circuit with like tuned tank circuit attached between terminal pin out for location 0.19 and 0.18. VDD is coupled to the first of two trap circuits to ground or power supply negative. The first of these two traps is tuned to the lower frequency while the second is tuned to the higher frequency. VCC is connected to the positive power supply through parallel tuned tank circuit that is tuned for the newer higher frequency. (See statement above at Fourth Stage (Development of Inverse Load Modulation). This is to be used by the number of stages necessary to covert from the lower load frequency to the higher Carrier Analog to Digital frequency (CAD).

Input to the carrier frequency via a trap circuit with trap from VCC to input at the carrier frequency also having tank tuned between location 0.19 and location 0.18. Tank circuit between VCC and power supply positive tuned at carrier frequency. Between VDD to ground or power supply negative is a tank circuit tuned at carrier frequency. Two tuned trap circuits one tapping at VCC and the other tapping at VDD connection through these two traps through primary winding, to center tap, of T1 with center tap to ground. Having this outer legs sharing connection with auto clock tuned trap circuits. Secondary of transformer T1 having two legs only, each having a negative bias diode and a positive bias diode forming a positive loop and a negative loop. Both of these loops are center tapped and fed to a shared clock output differential amplified signal. This combination is fed through parallel bus single wire to the various bit selective tuned switches as described below.

Auto Clock has two inputs that are capacitive coupled to the primary legs of T1. These inputs are run through a four way bridge as a means to save instantaneous peak voltages, also to double the frequency of the re-constituted bytes per second signal to be feed into Smitte trigger called out as U1 in the Auto Clock diagram which must receive two signwave signals in order to produce a single clock pulse. Thereby providing an output for latch triggering permitting asynchronous data transfer between systems, and sub-systems of hardware.

This circuit is done in the multiplies of the number of bits in parallel, e.g. 8 bit byte, 16 bit word, 32 bit double word, 64 bit data element, or etc. and/or parallel control multiply bit configuration bus.

Input is through a trapped circuit tuned for the corresponding bit phase sub-oscillating frequency having both RB1 parallel trap tuned for this bit frequency and RB2 tank circuit between location 0.19 and location 0.18. VCC is connected through tank circuit tuned to the bit corresponding frequency. VDD to ground or power supply negative connected through a tank circuit tuned to the bit corresponding frequency. Output is connected through additional amplifier for enabling multiply circuit bus loading.

'FEED FORWARD CURRENT LOOP TECHNOLOGY' is the ability to operate at frequency thresholds beyond 40 tera-cycles per second, the normal paradyne of modem circuits in transistor designs. Common belief is that 40 tera-Hertz is an unreachable limit. Now, we just simply described the path of current through input to output while maintaining the highest level of signal to noise ratio, maximum power efficiency, and having peak to peak output swing voltage equally positive most to the negative most power supply rail voltages. While being able to drive this circuits input at levels equaling 50% of the power supplies rail to rail voltages, the circuit will maintain a noise of $1/1,000,000$ the output value.

What is claimed is:

1. A feed forward current operational amplifier, comprising:
   an operational amplifier;
   a current dumping feed forward current circuit coupled to the operational amplifer and
   a coupling capacitor coupled to the current dumping feed forward current circuit so as to cross feed the variations between a negative wave form and a positive wave form.

\* \* \* \* \*